(12) United States Patent
Krasnov

(10) Patent No.: US 9,419,151 B2
(45) Date of Patent: Aug. 16, 2016

(54) HIGH-REFLECTIVITY BACK CONTACT FOR PHOTOVOLTAIC DEVICES SUCH AS COPPER—INDIUM-DISELENIDE SOLAR CELLS

(75) Inventor: Alexey Krasnov, Canton, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 0 days.

(21) Appl. No.: 13/455,300

(22) Filed: Apr. 25, 2012

(65) Prior Publication Data

US 2013/0284253 A1    Oct. 31, 2013

(51) Int. Cl.
*H01L 31/00* (2006.01)
*H01L 21/00* (2006.01)
*H01L 31/0224* (2006.01)
*H01L 31/0392* (2006.01)
*H01L 31/0749* (2012.01)

(52) U.S. Cl.
CPC .. *H01L 31/022425* (2013.01); *H01L 31/03923* (2013.01); *H01L 31/0749* (2013.01); *Y02E 10/541* (2013.01); *Y02P 70/521* (2015.11)

(58) Field of Classification Search
CPC .................. H01L 31/022425; H01L 31/0749; H01L 31/03923
USPC ................................................. 136/265, 256
See application file for complete search history.

(56) References Cited

U.S. PATENT DOCUMENTS

| 4,335,266 | A | | 6/1982 | Mickelsen et al. |
| 4,611,091 | A | | 9/1986 | Choudary et al. |
| 4,666,569 | A | * | 5/1987 | Basol .................. H01L 21/443 136/256 |
| 4,915,745 | A | * | 4/1990 | Pollock ............... C23C 14/0623 136/260 |
| 5,028,274 | A | * | 7/1991 | Basol .............. H01L 31/022425 136/260 |
| 5,477,088 | A | * | 12/1995 | Rockett .......... H01L 31/022425 136/256 |
| 5,958,358 | A | | 9/1999 | Tenne et al. |
| 6,077,722 | A | * | 6/2000 | Jansen et al. .................... 438/74 |
| 6,123,824 | A | | 9/2000 | Sano et al. |
| 6,288,325 | B1 | | 9/2001 | Jansen et al. |
| 6,784,361 | B2 | | 8/2004 | Carlson et al. |
| 7,875,945 | B2 | | 1/2011 | Krasnov et al. |

(Continued)

FOREIGN PATENT DOCUMENTS

| CN | 1 367 536 | 9/2002 |
| EP | 2 469 580 | 6/2012 |

(Continued)

OTHER PUBLICATIONS

Abou-Ras et al., "Formation and characterisation of MoSe2 for Cu(In,Ga)Se2 based solar cells", Thin Solid Films 480-481 (2005) 433-438.*

(Continued)

*Primary Examiner* — Luan Van
*Assistant Examiner* — Angelo Trivisonno
(74) *Attorney, Agent, or Firm* — Nixon & Vanderhye P.C.

(57) ABSTRACT

A photovoltaic device (e.g., solar cell) includes: a front substrate (e.g., glass substrate); a semiconductor absorber film; a back contact including a first conductive layer of or including an alloy of molybdenum (Mo) and copper (Cu) and optionally a second conductive layer of or including either molybdenum (Mo) or Cu; and a rear substrate (e.g., glass substrate). The first conductive layer of or including molybdenum and copper is located between at least the rear substrate and a semiconductor absorber film that is located between at least the back contact and the front substrate.

11 Claims, 7 Drawing Sheets

(56) References Cited

U.S. PATENT DOCUMENTS

| | | | |
|---|---|---|---|
| 2004/0063320 A1* | 4/2004 | Hollars | 438/689 |
| 2004/0144419 A1 | 7/2004 | Fix et al. | |
| 2004/0261841 A1 | 12/2004 | Negami et al. | |
| 2006/0180200 A1 | 8/2006 | Platzer Bjorkman et al. | |
| 2007/0093006 A1 | 4/2007 | Basol | |
| 2007/0193623 A1* | 8/2007 | Krasnov | 136/252 |
| 2009/0020157 A1 | 1/2009 | Krasnov et al. | |
| 2009/0260678 A1 | 10/2009 | Di Stefano | |
| 2009/0272422 A1 | 11/2009 | Li | |
| 2010/0059385 A1 | 3/2010 | Li | |
| 2010/0236629 A1* | 9/2010 | Chuang | 136/262 |
| 2010/0253204 A1 | 10/2010 | Boehler et al. | |
| 2010/0269907 A1* | 10/2010 | Lackner | C22C 27/04 136/264 |
| 2010/0297835 A1 | 11/2010 | Chuang et al. | |
| 2010/0300512 A1 | 12/2010 | Auvray et al. | |
| 2010/0326491 A1* | 12/2010 | Cheng et al. | 136/244 |
| 2011/0097841 A1 | 4/2011 | Krasnov et al. | |
| 2011/0168243 A1 | 7/2011 | Elowe et al. | |
| 2012/0006398 A1* | 1/2012 | Nguyen | H01L 31/022425 136/256 |
| 2012/0174977 A1* | 7/2012 | Choi | 136/256 |

FOREIGN PATENT DOCUMENTS

| | | |
|---|---|---|
| WO | WO 2006/047207 | 5/2006 |
| WO | WO 2010/141463 | 12/2010 |
| WO | WO 2012/033033 | 3/2012 |

OTHER PUBLICATIONS

U.S. Appl. No. 13/455,282, filed Apr. 25, 2012; Krasnov.

U.S. Appl. No. 13/455,317, filed Apr. 25, 2012; Krasnov et al.

U.S. Appl. No. 13/455,232, filed Apr. 25, 2012; Krasnov et al.

"Electrochemical Codeposition of Indium and Gallium for Chalcopyrite Solar Cells", Zank et al., Thin Solid Films 286 (1996), pp. 259-263.

"Chalcopyrite Thin Film Solar Cells by Electrodeposition", Lincot et al., Solar Energy 77 (2004), pp. 725-737.

"Electrodeposition of Indium on Copper for CIS/CIGS Solar Cell Applications"; Huang et al., 2010 The Electrochemical Society (1pg).

"Cu—Mo Contacts to CuInSe$_2$ for Improved Adhesion in Photovoltaic Devices"; Yang et al., Journal of Applied Physics, vol. 75, No. 2, Jan. 15, 1994, pp. 1185-1189.

International Search Report mailed Jun. 12, 2014.

International Search Report mailed Jun. 16, 2014.

"Effect of a Thermal Oxydation Pre-Treatment on Mo to Control the Growth and Formation of MoSe$_2$ Layers for Use for CIGS Solar Cells"; Duchatelet et al., 25$^{th}$ European Photovoltaic Solar Energy Conference and Exhibition, Sep. 6-10, 2010, pp. 3379-3381.

"A Comprehensive Characterization of the Interfaces in Mo/CIS/CdS/ZnO Solar Cell Structures"; Schmid et al., Solar Energy Materials and Solar Cells 41/42, (1996); pp. 281-294.

* cited by examiner

HIGH-REFLECTIVITY BACK CONTACT FOR PHOTOVOLTAIC DEVICES SUCH AS COPPER—INDIUM-DISELENIDE SOLAR CELLS

CROSS-REFERENCE TO RELATED APPLICATIONS

This application is related to U.S. patent application Ser. Nos. 13/455,232, 13/455,282, and 13/455,317 that were filed concurrently herewith, the entire disclosures of which are incorporated by reference herein in their entireties.

TECHNICAL FIELD

Certain embodiments of this disclosure relate generally to photovoltaic devices (e.g., solar cells), a back contact or rear electrode for use in photovoltaic devices such as solar cells, coated articles for use in photovoltaic devices such as solar cells, and methods of making the same. Certain embodiments of this disclosure more particularly relate to a back electrode configuration that includes a molybdenum-containing alloy resulting in high-efficiency solar cells. The back (or rear) electrode may also function as a rear reflector in certain example instances. According to certain example embodiments disclosed herein, a traditional molybdenum back contact typically used in CIGS solar cells is substituted with or includes a layer having improved reflectivity, such as, for example, an alloy of or including molybdenum and copper. A back contact comprising or consisting essentially of a molybdenum copper alloy provides substantially improved reflectivity of incident light as compared to arrangements having a back electrode formed solely of molybdenum. Increasing reflectivity improves performance of the photovoltaic device by increasing the amount of previously lost light reflected back into a the semiconductor absorber (e.g., CIGS based absorber) of the photovoltaic device, thereby reducing wasted light and improving charge generation. Moreover, a back contact according to certain example embodiments that comprises an alloy including molybdenum and copper is substantially compatible with the semiconductor absorber film (e.g., CIGS based absorber film) and does not significantly compromise performance of the photovoltaic device.

BACKGROUND AND SUMMARY OF EXAMPLE EMBODIMENTS

Many different types of photovoltaic devices are known in the art (e.g., see U.S. Patent Document Nos. 2004/0261841, 2006/0180200, U.S. Pat. Nos. 4,335,266, 4,611,091, 6,784, 361, 6,288,325, 6,631,603, and 6,123,824, the disclosures of which are incorporated by reference herein in their entireties). Examples of known photovoltaic devices include CIGS (approximately $CuIn_{x-1} Ga_xSe_2$ and/or $CuIn_{x-1}Ga_xSe_2$) solar cells. CIGS films are conductive semiconductor compounds that are often referred to as an absorber or light absorbing layer(s) or film. Generally speaking, CIGS type photovoltaic devices include, from the front (or light incident) side moving rearwardly, a front transparent cover sheet (substrate) of material such as glass, a front electrode comprising a transparent conductive layer(s) (e.g., a transparent conductive oxide such as zinc oxide), a light absorption semiconductor film (e.g., CIGS), a rear electrode or contact, and a rear substrate of a material such as, for example, glass (or metal foil for certain example flexible applications). In some instances, an adhesive may be provided between the front substrate and the front electrode. It is also the case in some instances that the device is provided with window layer(s) (e.g., of or including CdS, ZnS, or the like). Photovoltaic power is generated when light incident on the front side (or front substrate) of the device passes through the front electrode and is absorbed by the light absorption semiconductor film (e.g., CIGS), as is known in the art. Certain designs may also utilize compositional grading of the semiconductor absorber, for example, with an increased Ga/(Ga+In) ratio toward the rear electrode or contact. Photovoltaic devices having a compositionally graded CIGS absorber may, for example, be made using a two- or three-step deposition process.

For example, with reference to FIG. 1, there is generally provided a schematic cross-sectional diagram illustrating various elements of a CIGS-type photovoltaic device 10. The cell 10 is structurally supported on a rear glass substrate (or back glass) 12. A back contact made up of a metal layer, such as, for example, molybdenum (Mo) 14 is typically deposited on the rear glass substrate 12. The first active region of the device 10 comprises a semiconductor layer 16 which is typically a p-type copper indium/gallium diselenide (CIGS). A thin "window" layer of n-type compound semiconductor 18, typically comprising cadmium sulfide (CdS) may then be formed on CIGS layer 16. A layer of conducting wide bandgap material 25, typically formed of a substantially transparent conductive metal oxide such as zinc oxide, is deposited on the CdS layer 18 and acts as a transparent front contact for the photovoltaic device 10. The device 10 may be completed by including a series of front face contacts (not shown) in the form of, for example, a metal grid on top of the transparent front contact 21 to facilitate the extraction of generated electrons, and a front glass substrate 21. A large solar cell may also be divided into a number or smaller cells by means of scribes, such as, for example, laser or mechanical scribes or the like, traditionally referred to as P1, P2 and P3, which allow individual cells to be connected in series.

As noted above, a metal such as Mo may be used as the rear electrode (or back contact) 14 of a photovoltaic device, such as, for example, a CIGS solar cell 10, to extract positive charges generated in the CIGS semiconductor absorber 16 of the solar cell 10. In certain instances, the Mo rear electrode 14 may be sputter-deposited using, for example, direct-current magnetron sputtering, onto the back glass substrate 12 of the CIGS solar cell 10. There are certain advantages associated with using Mo as the material for the rear electrode 14. Among these are, for example, Mo is inert to the CIGS absorber, and thus does not harmfully interfere with the CIGS and does not substantially alter the electrical, optical or mechanical properties of the CIGS. In addition, using Mo to form the rear contact 14 may result in the formation of a thin molybdenum selenide ($MoSe_2$) layer (not shown) at the interface between the Mo rear electrode 14 and the CIGS film 16. The formation of a $MoSe_2$ layer during the selenization step at the interface between the CIGS and the Mo rear contact provides a an ohmic (e.g., non-rectifying) contact to the CIGS absorber, which, in turn, facilitates hole extraction with reduced losses. Moreover, the formation of a $MoSe_2$ interface layer facilitates optical matching between the rear contact and the CIGS absorber. Using sputter deposited Mo as the rear contact is also advantageous in that it is know to produce a surface morphology that is beneficial in CIGS growth for the formation of crystallites with large grain sizes that result in high carrier mobility, and thus higher efficiency photovoltaic devices.

However, using substantially Mo alone as the material for the back contact 14 of the solar cell 10 also suffers from certain disadvantages. In arrangements that utilize compositional grading of the CIGS semiconductor absorber, for example, with increased Ga/(Ga+In) ratio toward the rear electrode or contact, the increased Ga concentration at the back of the photovoltaic device may lead to an increased bandgap of the absorber, which may result in lower absorption of incident light radiation (e.g., solar light referred to as AM 1.5 spectrum), particularly in the near infrared region. This increased bandgap and corresponding lower absorption of light radiation reduces overall efficiency of the photovoltaic device because a portion of the solar light passes through the absorber without contributing to charge generation. The loss associated with incomplete light absorption typically increases with reduced thickness of the CIGS absorber.

An example way to improve overall efficiency of CIGS-type photovoltaic devices is to reflect light initially passed through the CIGS absorber back through the absorber (16 and/or 18), effectively recycling previously unused lost light by utilizing otherwise wasted light energy for charge generation. Unfortunately, however, pure molybdenum back contacts 14 are generally poor reflectors of solar light (e.g., the AM 1.5 spectrum), resulting in inadequate reflection of light that initially passed through the CIGS absorber back into the CIGS absorber.

According to certain example embodiments, it would be advantageous to use a portion of the non-absorbed light propagated through the CIGS absorber in the first pass by reflecting this unused light from the rear contact back into the semiconductor absorber (16 and/or 18) for a second pass to provide additional charge generation. In this regard, the higher the reflectivity of the rear contact, the higher the probability of harnessing the reflected light for additional current generation. An example wavelength of interest is in a range of from about 300 to 1200 nm, which are wavelengths where the CIGS absorber is sensitive to the AM 1.5 light. However, as noted above, back contacts consisting of Mo are generally considered to be poor reflectors of solar light (e.g., the AM 1.5 spectrum), resulting in inadequate reflection of light that initially passed through the CIGS absorber back into the CIGS absorber, and thus fail to achieve significant harnessing of otherwise wasted light for additional charge generation in the manner described above. In addition to low AM 1.5 reflectivity, molybdenum is relatively expensive and has a relatively low sputter deposition rate.

In order to achieve greater reflectivity of the rear contact, materials having high reflectivity coupled with compatibility with the CIGS absorber may be, for example, incorporated in a rear electrode. For example, as disclosed in commonly assigned co-pending U.S. patent application Ser. No. 13/455,232, entitled, "Back Contact for Photovoltaic Devices Such as Copper-Indium-Diselenide Solar Cells," filed concurrently herewith, the disclosure of which is incorporated by reference herein in its entirety, a low-cost copper based back contact terminated with a molybdenum layer provides certain example improvements in photovoltaic device cost and performance. In order to increase reflectivity and improve the absorption of light wasted on the first pass through the CIGS absorber by reflecting the lost light back through the CIGS absorber from the rear contact, a reflective conductive material, such as, for example, copper, that is also compatible with the CIGS absorber may be introduced into, and/or as part of, the rear contact. Moreover, for example, copper (Cu) is native to CIGS and thus does not substantially negatively affect the properties of the CIGS absorber. In addition, as disclosed in U.S. patent application Ser. No. 13/455,232, the addition of copper also has benefits with respect to deposition rate, lower cost and improved thermal conductivity of the rear contact. Improved thermal conductivity of the rear contact is also beneficial for improving the uniformity of thermal distribution during the high-temperature selenization process that is part of certain example methods for forming the CIGS absorber.

In certain example embodiments, an alloy of or including molybdenum and copper (e.g., MoCu) is used to form at least a portion of a back contact, as opposed to one that consists solely of molybdenum. MoCu exhibits substantially higher reflection of light in the AM 1.5 spectrum as compared to molybdenum alone. Additionally, MoCu has a more durable composition making it more suitable in packaging and transportation from large-area thin-film coating facilities to photovoltaic device manufacturing sites. The MoCu, which may make up all or part of the conductive back contact, may for example be disposed close or adjacent to the CIGS absorber.

In certain example embodiments, a rear contact having a high reflectance, such as, for example, preferably in a range of about the 300-1200 nm spectral region, is provided. High reflectance in this example range may be especially preferable, for example, where a thinner absorber (e.g., CIGS based semiconductor absorber) is used, and where at least a portion of the absorber has a lower absorption, e.g., lower extinguishing coefficient, as is the case in certain compositionally graded CIGS configurations. Where a thinner absorber, e.g. CIGS absorber, is used, a thinner absorber provides certain advantages, such as, for example, and without limitation, lower manufacturing and material cost. Moreover, arrangements having CIGS absorbers incorporating compositional grading, such as, for example, a CIGS absorber having composition Ga/(Ga+In) grading that forms an electron reflector to keep electrons from the back contact where they would easily be lost through recombination with the holes, may result in an arrangement having increased CIGS bandgap at the back portion of the absorber. As discussed above, this increased bandgap may result in lower absorption of incident light radiation (e.g., solar light referred to as AM 1.5 spectrum), particularly in the near infrared region. According to certain example embodiments disclosed herein, providing a rear contact (e.g., of or including MoCu) with a high reflectance may advantageously provide improved recycling of the otherwise lost light that passes through the absorber on the first pass.

Other materials that have excellent reflective properties for the AM 1.5 spectrum suffer from certain drawbacks. For example, silver has a high material cost. Additionally, a pure silver layer would interfere with the properties of the CIGS absorber when exposed to high processing temperatures typically used to form the CIGS absorber. In this regard, the optical and electrical properties of silver change considerably when it reacts with selenium. Thus, a pure silver hack contact would be undesirable. As discussed above, the absorber may undergo a high temperature selenization process, for example as part of a CIGS formation process. Moreover, a pure silver back contact would likely result in a buffer layer of $Ag_2Se$ being formed at the interface of the silver and CIGS absorber during the post-deposition high temperature selenization process which would not improve the optical properties of the reflected light in the same way or to the extent as $MoSe_2$ in the case of, for example, a molybdenum-containing rear contact.

As discussed above, however, copper is an excellent AM 1.5 reflector, especially in the near-infrared spectral region, an example region of interest. A significant advantage of copper is that it is a main component of the CIGS absorber and thus does not affect the opto-electric properties of the CIGS absorber. Moreover, as disclosed in U.S. patent application Ser. No. 13/455,232, the addition of copper also has benefits with respect to deposition rate, lower cost and improved thermal conductivity of the rear contact. For example, copper is typically cheaper than molybdenum, has significantly higher electrical conductivity as compared to molybdenum, and has a higher sputter rate as compared to molybdenum. Copper also forms a durable alloy with molybdenum, enabling an arrangement that can take advantages of the beneficial properties of both molybdenum and copper. It is noted that the reflectivity of a MoCu alloy generally increases with the increasing ratio of Cu/Mo. Another example advantage of using a MoCu alloyed rear contact is that it combines high reflectance of the copper and molybdenum in the long-wavelength and short-wavelength regions, respectively. In a preferred example embodiment, the Mo/Cu ratio is in a range of from about 20 wt. % Mo/80 wt. % Cu to 80 Wt. % Mo/20 wt. % Cu, and with an example being about 30 wt. % Mo/70 wt. % Cu. The back contact alloy comprising or consisting essentially of MoCu may include, by weight, from about 10-90% Mo, more preferably from about 20-80% Mo, still more preferably from about 20-60% Mo, even more preferably from about 20-40% Mo, and from about 20-90% Cu, more preferably from about 30-90% Cu, still more preferably from about 40-80% Cu, even more preferably from about 60-80% Cu, with an example MoCu alloy including about 30% Mo and about 70% Cu.

Yet another example advantage of rear contact comprising or consisting essentially of MoCu alloy is that the conductivity of MoCu alloys is higher than that of molybdenum, which provides the benefit of, for example, a more uniform heat distribution in the lateral direction during the high-temperature selenization process used in forming the CIGS absorber.

In certain example embodiments, when using a rear contact of or including a MoCu alloy that is disposed adjacent or close to the CIGS absorber, a MoCuSe transition layer may be formed immediately adjacent the CIGS absorber during the high-temperature CIGS selenization process. This MoCuSe transition layer may, for example, advantageously further improve the back-reflected light absorption of the CIGS absorber, thereby providing improved efficiency and performance of a photovoltaic device according to certain example embodiments.

Furthermore, alloying copper and molybdenum provides even additional example advantages, including, for example, and without limitation, the presence of molybdenum improves the integrity of the rear contact, the presence of molybdenum avoids the formation of an extended transitional region between the rear contact and the CIGS absorber, the presence of molybdenum is beneficial for producing large grain sizes for the CIGS absorber and thus higher carrier mobility and reduced electrical losses, and bonding of copper to molybdenum prevents (or reduces) the copper from excessive diffusion into the CIGS absorber thus avoiding substantial changes in the CIGS stoichiometry due to any such diffusion.

There may be any number of advantageous rear contact configurations that may be realized in accordance with example embodiments disclosed herein. For example, and without limitation, the MoCu based alloy may form substantially the entire rear contact, or the MoCu based alloy may form the outermost portion of a substantially molybdenum rear contact, or the MoCu based alloy may form an outermost portion of a substantially copper containing rear contact.

In certain example embodiments of this invention, there is provided a photovoltaic device (e.g., solar cell) comprising: a front substrate; a semiconductor absorber film; a back contact comprising a conductive layer comprising or consisting essentially of an alloy of molybdenum and copper; and a rear substrate; wherein the conductive layer comprising or consisting essentially of an alloy of molybdenum and copper is located between at least the rear substrate and the semiconductor absorber film, and wherein the semiconductor absorber film is located between at least the back contact and the front substrate.

In certain other example embodiments of this invention, there is provided a coated article for use in a photovoltaic device (e.g., solar cell) comprising: a semiconductor absorber film; a back contact comprising a first conductive layer comprising or consisting essentially of an alloy of molybdenum and copper; and a rear substrate; wherein the first conductive layer comprising of consisting essentially of an alloy of molybdenum and copper is located between at least the rear substrate and the semiconductor absorber film, and wherein the semiconductor absorber film is located between at least the back contact and the front substrate. In further example embodiments, an additional (or second) conductive layer comprising molybdenum or copper may be disposed between the rear substrate and the first conductive layer.

These and other example embodiments and example advantages are described herein with respect to certain example embodiments and with reference to the following drawings in which like reference numerals refer to like elements, and wherein:

DETAILED DESCRIPTION OF EXAMPLE EMBODIMENTS

Figure 1:
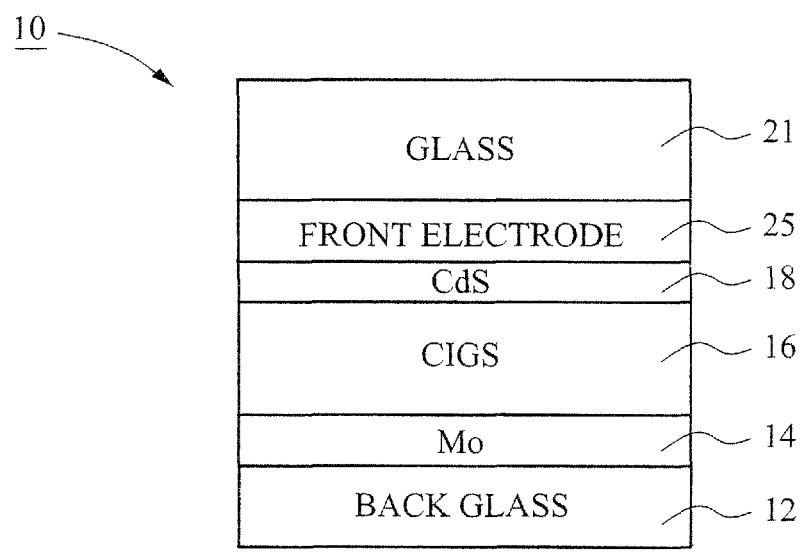
FIG. 1 is a cross sectional view of an example known CIGS photovoltaic device.

Referring now more particularly to the figures in which like reference numerals refer to like elements in the several views, detailed descriptions of example embodiments are disclosed herein.

Photovoltaic devices such as solar cells convert solar (or other light) radiation into usable electrical energy. The energy conversion typically occurs as a result of the photovoltaic effect. Light radiation (such as, for example, sunlight) impinging on a photovoltaic device and absorbed by an active region of semiconductor material (e.g., a semiconductor film including one or more semiconductor layers, such as, for example, CIGS), sometimes called an absorbing layer or film, generates electron-hole pairs in the active region. The electrons and holes may be separated by an electric field of a junction in the photovoltaic device. The separation of electrons and holes by the junction results in the generation of an electric current and voltage. In certain example embodiments, the electrons flow toward the region of the semiconductor material having n-type conductivity, and holes flow toward the region of the semiconductor having p-type conductivity. Current can flow through an external circuit connecting the n-type region to the p-type region (or vice versa) as impinging light energy continues to generate electron-hole pairs in the photovoltaic device.

In certain example embodiments disclosed herein, the absorption film, or absorber, may be of or include CIGS (approximately $CuIn_{X-1}Ga_XSe_2$). In certain example embodiments disclosed and described herein, there is provided a rear opaque and/or reflective electrode (e.g., 24, optionally also including one or more of 26, 29, 30 and/or 32) for CIGS photovoltaic (e.g., solar cell) devices that is deposited using magnetron sputter-deposition of a substantially molybdenum copper (MoCu) alloyed target. According to example embodiments disclosed and described herein a reflective back contact (e.g., 24, optionally also including one or more of 26, 29, 30 and/or 32) includes at least a portion and/or layer 24 (and possibly also 26) comprising or consisting essentially of an alloy of MoCu. In certain example embodiments, the substantially MoCu containing portion (e.g., 24) of the reflective rear contact may, for example, and without limitation, have a thickness in a range of about 5-800 nm.

According to certain example embodiments discussed in greater detail herein with reference to the drawings, there may be any number of advantageous rear contact configurations that may be realized in accordance with example embodiments disclosed herein. For example, and without limitation, the MoCu alloy (24 and/or 26) may form substantially the entire rear contact (e.g., see FIG. 2), alternatively the MoCu alloy may form the outermost portion of a contact (e.g., adjacent or closer to the CIGS absorber) substantially comprising molybdenum (e.g., see FIG. 3), or the MoCu alloy may form an outermost portion of a substantially copper containing rear contact (e.g., see FIG. 4).

In addition, according to example embodiments described and disclosed herein, an additional stress matching or adhesion layer 30 including copper oxide ($CuO_X$) may be provided between the Cu layer and the back glass substrate in example embodiments in which Cu forms the bulk of the rear contact. A $CuO_X$ layer 30 may be, for example, provided adjacent the back glass substrate 22 and between the back glass substrate 22 and a Cu based layer 32 is used to form a solid bond between the Cu and the back glass substrate, as metallic copper does not generally stick well to the glass. The $CuO_X$ inclusive layer 30 may be stoichiometric, or substoichiometric, in example embodiments. This stress matching or adhesion layer of or including $CuO_X$ may be deposited by reactive sputtering from a metal Cu target in an argon and oxygen ($Ar+O_2$) atmosphere, with oxygen partial pressures being, for example, and without limitation, around about 0.3 to 0.6 mTorr. The resulting thickness of the $CuO_X$ matching/adhesion layer is, for example, preferably in a range of 3-50 nm. Other possible alternatives for matching/adhering Cu to the back glass substrate may include, for example, and without limitation, a thin (e.g., ~1-10 nm) titanium (Ti) or chromium (Cr) based layer. Alternatively, the conductive copper layer may be an oxidation graded copper layer having greater oxidation at a portion adjacent the back glass substrate, such that the portion having the greater oxygen concentration can provide the stress matching function of a copper oxide stress matching layer. It will be understood in example embodiments including an oxidation graded conductive layer, the grading need not be continuous, and may be discontinuous. By providing a stress matching/adhesion layer or an oxidation graded Cu layer, improved adhesion of the Cu layer to the back glass substrate may be achieved.

Figure 2:
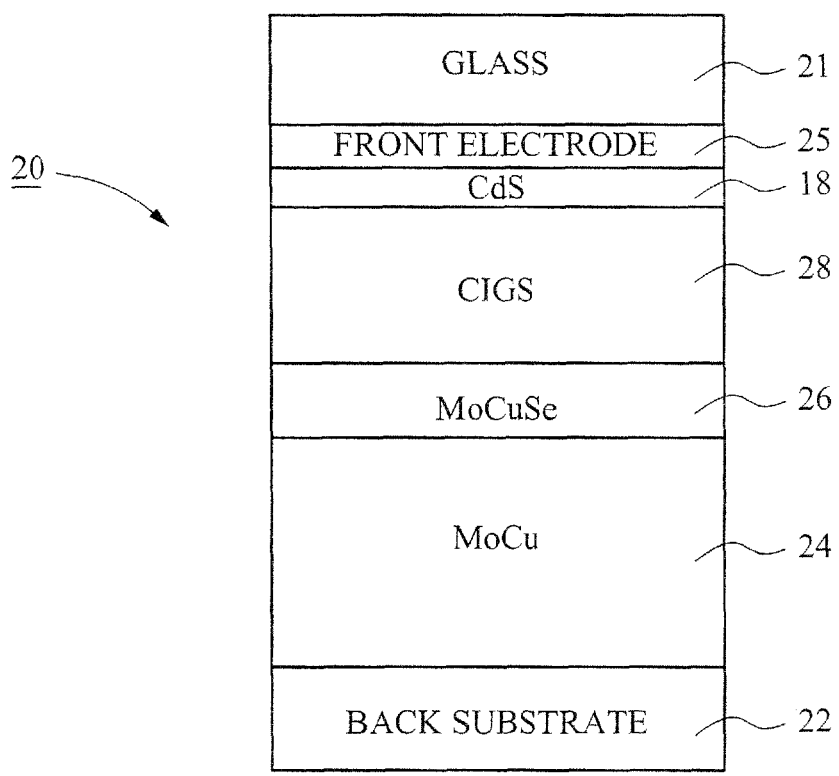
FIG. 2 is a cross sectional view of an example coated article for use in a photovoltaic device, such as, for example, a solar cell according to certain example embodiments disclosed herein, in which a bulk of the back contact comprises MoCu.

With reference to FIG. 2, a cross section of an example CIGS photovoltaic device 20 including a reflective back contact configuration substantially comprising or consisting essentially of MoCu according to an example embodiment is illustrated. The photovoltaic device (e.g., solar cell) is structurally supported on a back substrate 22, which may, for example, and without limitation, comprise soda-lime-silica based glass or a metal foil in certain example flexible applications. A back contact substantially comprising MoCu 24 (and possibly also 26) may be deposited/formed on or above the back substrate 22. In an example embodiment, a preferred method of depositing the MoCu layer 24 is, for example, and without limitation, by direct-current magnetron beam sputtering of a substantially molybdenum copper (MoCu) alloyed target. The thickness of the layer 24 of or including MoCu may preferably be, for example, in the range of about 5-800 nm. The thickness of the MoCu layer 24 in FIG. 2, may further preferably be in the range of about 100-600 nm and even more preferably in a range of about 150-300 nm, or preferably about 200 nm. Layer 24 of or including MoCu may of course be doped with other material(s) in certain example embodiments of this invention, and need not be purely made of only Mo and Cu.

With continuing reference to FIG. 2, the active or absorbing region of the device 20 is formed on or above the MoCu based layer 24 of the back contact, and preferably contains a semiconductor film 28 comprising copper indium diselenide and/or p-type CIGS layer (approximately $CuIn_{X-1}Ga_XSe_2$). The CIGS film 28 may be deposited by co-evaporation, sputtering, electroplating or any other suitable method. For example, and without limitation, an example method of forming CIGS may include providing a layer of or including a seed layer of deposited Cu (using sputtering, electroplating or any other deposition technique, as noted above), other components of the CIGS absorber, e.g., indium and/or gallium are deposited on a Cu layer and then react with the Cu at high temperatures in a selenium atmosphere, forming the CIGS semiconductor absorber 28. The CIGS absorber 28 may, for example, and without limitation, include a compositionally graded CIGS semiconductor absorber, for example, with increased Ga/(Ga+In) ratio toward the rear electrode or contact. In such arrangements, the increased Ga concentration at the back of the photovoltaic device may lead to an increased bandgap of the absorber, which may result in lower absorption of incident light radiation (e.g., solar light referred to as AM 1.5 spectrum), particularly in the near infrared region. This increased bandgap and corresponding lower absorption of light radiation reduces overall efficiency of the photovoltaic device because a portion of the solar light passes through the absorber without contributing to charge generation. The loss associated with incomplete light absorption typically increases with reduced thickness of the CIGS absorber.

However, as discussed above, providing a reflective back contact at least a portion of which substantially comprises MoCu (e.g., see layer 24) provides a back contact having improved reflectivity. As discussed above, it would be advantageous to use a portion of the non-absorbed light propagated through the CIGS absorber 28 in the first pass by reflecting this unused light from the rear contact back into the CIGS for a second pass to provide additional charge generation. In this regard, the higher the reflectivity of the rear contact, the higher the probability of harnessing the reflected light for additional current generation. An example wavelength of interest is in a range of from about 300 to 1200 nm, which are wavelengths where the CIGS absorber is sensitive to the AM 1.5 light. Providing a reflective back contact (24, and possibly including 26) at least a portion of which substantially comprises MoCu provides a back contact having improved reflectivity, which, in turn may improve the absorption of light wasted on the first pass through the CIGS absorber by reflecting the lost or wasted light back through the CIGS absorber from the rear contact.

It is advantageous to include copper as part of the back contact (24, and possibly including 26) to further improve the performance of the photovoltaic device 20. For example, copper is compatible with the CIGS absorber 28 and may be introduced into, or as part of the rear contact, such as, for example, a rear contact substantially comprising MoCu. Because, for example, copper is native to CIGS, the MoCu containing rear contact (e.g., 24) does not substantially negatively affect the properties of the CIGS absorber.

It is also noted that a thin layer of or including MoCuSe 26 may be formed at the interface between the MoCu layer 24 and the CIGS absorber 28 during the high-temperature selenization process used to form the GIGS absorber 28. This transitional layer of or including MoCuSe 26 may form as a discrete layer or may be a selenized portion of the underlying MoCu 24, that has been formed during the high-temperature selenization process used to form the GIGS, and has been found to further improve back-reflected light absorption by the GIGS absorber 28.

Optical benefits of a highly-reflective contact used in highly absorbing CIGS-type photovoltaic devices become most noticeable at GIGS absorber thicknesses of below about 800 nm. Further consideration in the calculation of the MoCuSe transitional layer 26 between the MoCu layer 24 and the GIGS absorber 28 may result in further improvement of light coupling from the substantially MoCu containing portion of the rear contact into the GIGS absorber 28.

In the photovoltaic device of any embodiment herein, optionally a dielectric layer (e.g., of or including silicon nitride and/or silicon oxynitride) may be located directly on the rear substrate 22 and be located between at least the rear substrate and the MoCu layer 24.

Generally speaking, alloying copper with molybdenum provides further advantages. For example, the presence of molybdenum in the rear contact provides integrity of the contact and avoids formation of an extended transitional region between the rear contact and the GIGS absorber. Another example advantage provided by alloying copper with molybdenum, for example, is that the presence of molybdenum is beneficial for in providing large grain size for the CIGS absorber and, as a result provides high carrier mobility and reduced electrical losses. A still further example advantage is provided because the bonding of copper to molybdenum prevents the copper from excessive diffusion into the CIGS absorber, and as a result, preserves the desired CIGS stoichiometry.

It is noted that the reflectivity of a MoCu alloy generally increases with the increasing ratio of Cu/Mo. Another example advantage of using a MoCu alloyed rear contact is that it combines high reflectance of the copper and molybdenum in the long-wavelength and short-wavelength regions, respectively. In a preferred example embodiment, the Mo/Cu ratio is in a range of about 20 wt. % Mo/80 wt. % Cu to 80 Wt. % Mo/20 wt. % Cu, and more preferably about 30 wt. % Mo/70 wt. % Cu. Yet another example advantage of a MoCu alloyed rear contact is that the conductivity of MoCu alloys is higher than that of molybdenum, which provides the benefit of, for example, a more uniform heat distribution in the lateral direction during the high-temperature selenization process While a preferred embodiment according to the FIG. 2 embodiment is made up of the layers shown in FIG. 2, other non-illustrated layer(s) may also be provided. For example, an anti-reflection film (not shown) may be provided on the light incident side of the front substrate (not shown), a further electrode or dielectric layer(s) may be provided between the front substrate and the front electrode, and so forth. The front transparent conductive electrode 25 and the front (or light incident side) transparent substrate 21 are the same in the FIG. 2-4 embodiments as the front transparent conductive electrode 25 and the front transparent substrate 21 shown and discussed in connection with FIG. 1.

Figure 3:
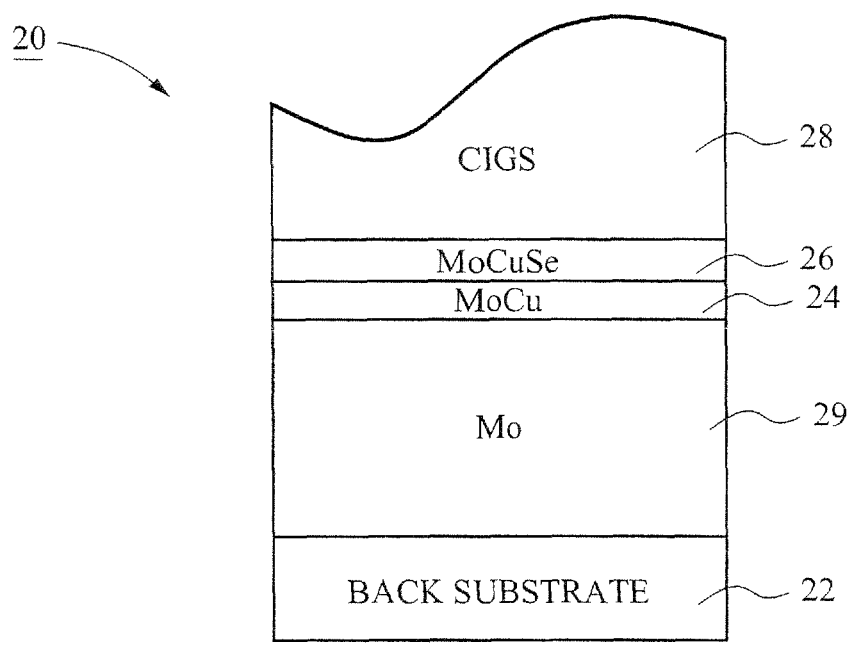
FIG. 3 is a cross sectional view of an example coated article for use in a photovoltaic device, such as, for example, a solar cell according to certain example embodiments disclosed herein in which a bulk of the back contact comprises Mo and an outermost portion of the Mo back contact includes a MoCu alloy.

Referring now to FIG. 3, another example embodiment is provided. It is noted that the advantages discussed above provided by including a MoCu containing rear contact are also provided by the example embodiment discussed herein with respect to FIG. 3. In the example embodiment illustrated in FIG. 3, the rear contact includes an additional reflective conductive layer 29 of conductive material (i.e., in addition to MoCu based layer(s) 24, 26) substantially comprising or consisting essentially of Mo 29. With continuing reference to FIG. 3, a bulk of the rear contact comprises or consists essentially of Mo 29, and further includes MoCu layer 24 above the substantially Mo layer 29. The substantially MoCu layer 24 is preferably disposed at an outermost portion of the substantially Mo layer 29 adjacent or closer to the CIGS absorber 28. According to this example embodiment, the thickness of the substantially Mo portion 29 of the rear contact is preferably in a range of about 5-300 nm As with the example embodiment described above with respect to FIG. 2, a transitional layer of or including MoCuSe 26 may be formed during the high-temperature selenization process used to form the CIGS absorber 28.

Yet another example embodiment is discussed with reference to FIG. 4. In this example embodiment, the substantially Mo layer 29 illustrated in FIG. 3, is substituted with a layer comprising or consisting essentially of copper (Cu) 32. It is noted that the advantages discussed above provided by including a MoCu containing rear contact are also provided by the example embodiment discussed herein with respect to FIG. 4. In the example embodiment illustrated in FIG. 4, the rear contact includes a layer substantially comprising or consisting essentially of Cu 32 and MoCu layer 24 disposed above the substantially Cu layer 32. The substantially MoCu layer 24 is preferably disposed at an outermost portion of the substantially Cu layer 32 adjacent or closer to the CIGS absorber 28. According to this example embodiment, the thickness of the substantially Cu portion 32 of the rear contact is preferably in a range of about 5-300 nm. As with the example embodiment described above with respect to FIG. 2, a beneficial transitional layer of MoCuSe 26 may be formed during the high-temperature selenization process used to form the CIGS absorber 28.

According to further example embodiments, it may be preferable to provide additional layer(s) to improve the performance characteristics of the photovoltaic device(s) disclosed herein. Referring to FIG. 4, the device 20 may be provided, for example, with an additional matching/adhesion layer 30, substantially comprising copper oxide (CuOx) 30. As discussed above, an additionally stress matching or adhesion layer 30 including CuOx may be provided between the Cu layer 32 and the back substrate 22. The CuOx layer 30, which may, for example, preferably be provided adjacent the back substrate 22, and between the back substrate 22 and the substantially Cu layer 32, is used to form a solid bond between the Cu of layer 32 and the glass of a back substrate 22, as metal copper does not generally stick well to glass. The $CuO_X$ layer 30 may be stoichiometric, or substoichiometric, in example embodiments. This stress matching or adhesion layer of or including $CuO_X$ 30 may be deposited by reactive sputtering from a metal Cu target in an argon and oxygen $(Ar+O_2)$ atmosphere, with oxygen partial pressures being, for example, and without limitation, around about 0.3 to 0.6 mTorr. The resulting thickness of the $CuO_X$ matching/adhesion layer 30 is, for example, preferably in a range of 3-50 nm. Other possible alternatives for matching/adhering Cu to the back glass substrate may include, for example, and without limitation, a thin (e.g., ~1-10 nm) titanium (Ti) or chromium (Cr) based layer. Alternatively, the conductive copper layer 32 may be an oxidation graded copper layer having greater oxidation at a portion adjacent the back glass substrate 22, such that the portion having the greater oxygen concentration can provide the stress matching function of a copper oxide stress matching layer 30. It will be understood in example embodiments including an oxidation graded conductive layer, the grading need not be continuous, and may be discontinuous. By providing a stress matching/adhesion layer or an oxidation graded Cu layer, improved adhesion of the Cu layer 32 to the back glass substrate 22 may be achieved.

As with the example embodiments discussed above with reference to FIGS. 2 and 3, it is also noted that a thin layer of or including MoCuSe 26 may be formed at the interface between the MoCu containing portion of the rear contact and the CIGS absorber 28 during the high-temperature selenization process used to form the CIGS absorber 28. This transitional layer of MoCuSe 26 has been found to further improve back-reflected light absorption by the CIGS absorber 28.

Further example metals may be alloyed with Mo in place of Cu in the MoCu portion of the rear contact configurations discussed above. For example, other metals such as tantalum (Ta) and niobium (Nb) are known not to interfere with the CIGS absorber and can be used to form an alloy with Mo instead of or in addition to Cu in certain alternative example embodiments of this invention in connection with FIGS. 2-4. However, these metals (e.g., Ta and Nb) suffer from a number of drawbacks similar to those of Mo, e.g., high material cost, low sputter deposition rates and not being as good an AM 1.5 reflector as compared to Cu, and thus may not be as beneficial as Cu.

Figure 4:
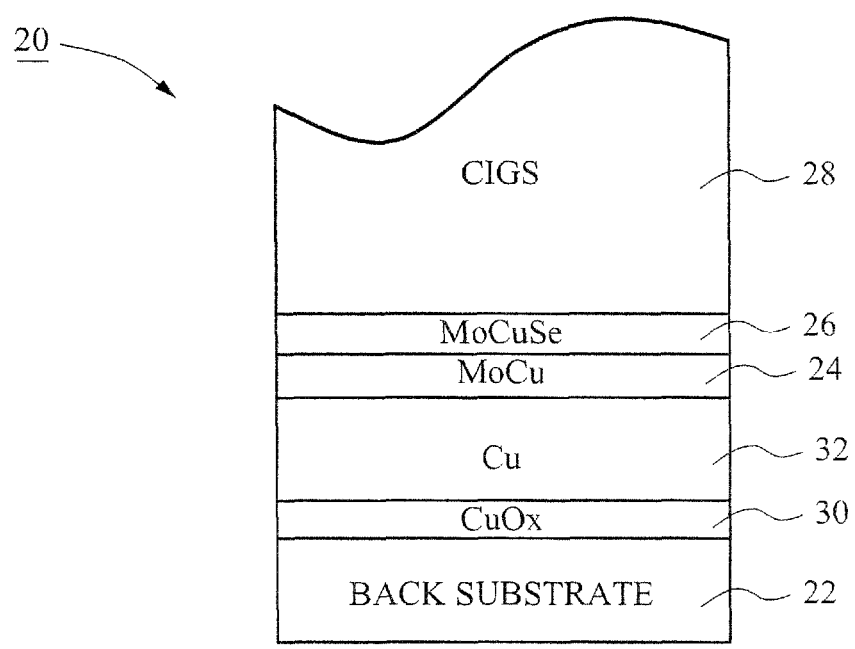
FIG. 4 is a cross sectional view of an example coated article for use in a photovoltaic device, such as, for example, a solar cell according to certain example embodiments disclosed herein, in which a bulk of the back contact comprises Cu and an outermost portion of the Cu back contact includes a MoCu alloy.
Figure 5A:
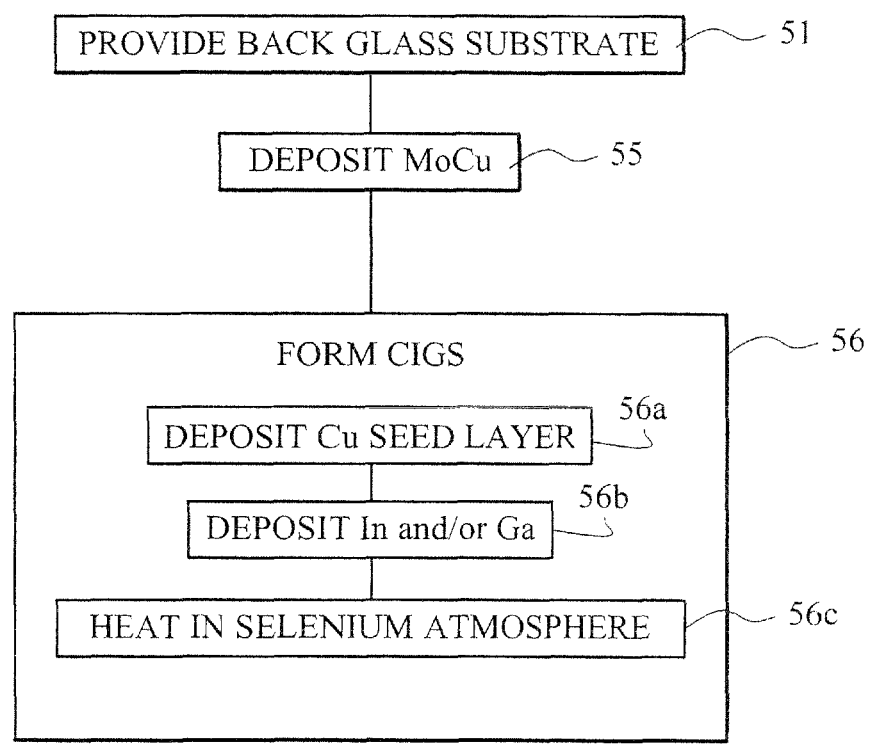
FIGS. 5A-5C are flowcharts illustrating example methods of making a coated article for use in a photovoltaic device, such as, for example, a solar cell, according to certain example embodiments disclosed herein
Figure 5B:
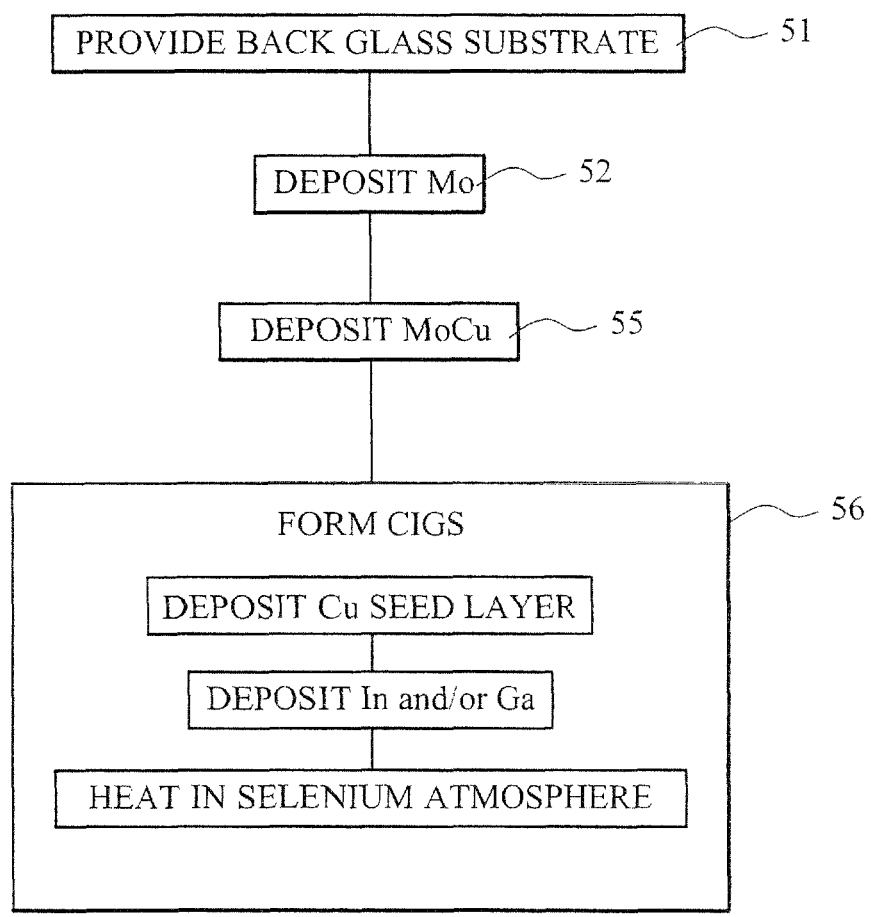
Figure 5C:
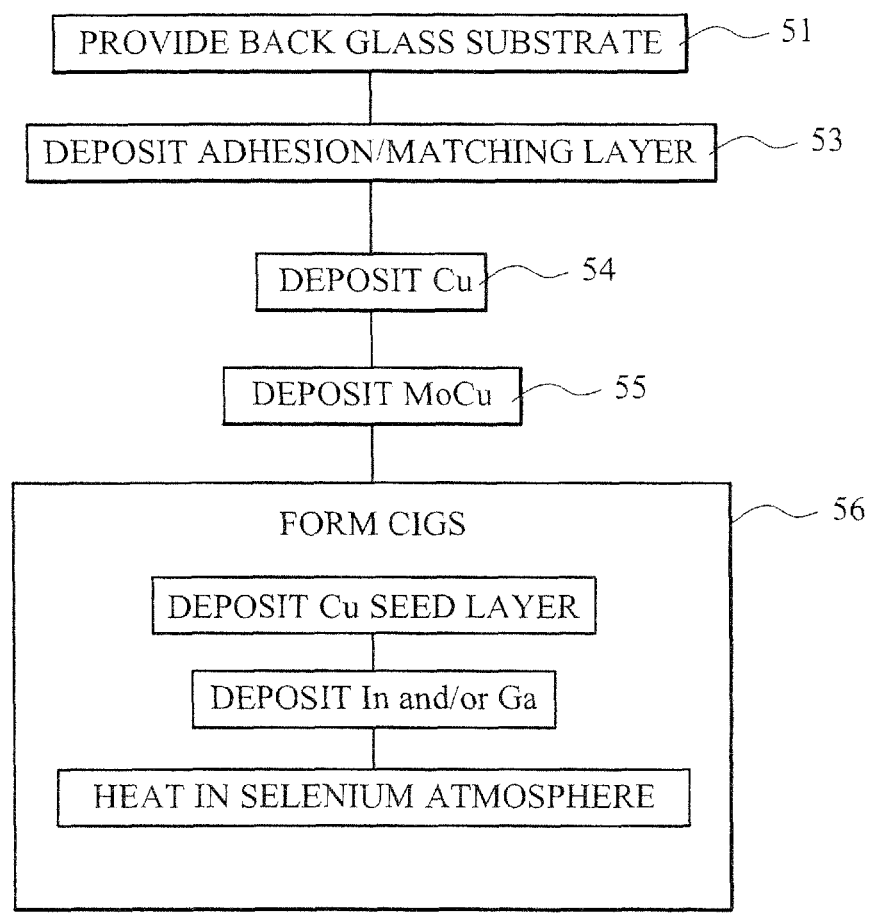

An example method of making a photovoltaic device or coated article for use in a photovoltaic device, such as, for example, a solar cell, according to certain example embodiments disclosed herein, such as, and without limitation the devices illustrated in FIGS. 2-4, is described herein with reference to FIGS. 5A-5C. Referring now to FIG. 5A, a back substrate 22, which may, for example, and without limitation, comprise soda-lime-silica based glass may be provided (S1) as a substrate for a coated article for use in a photovoltaic device, such as, for example, a solar cell. A back contact configuration comprising a layer including MoCu is then deposited S5, preferably by direct-current magnetron sputtering over the back substrate 22. According to certain example embodiments, the back contact comprising a MoCu layer 24 may also include a MoCuSe transition layer 26 formed over the MoCu layer 24 as a result of the heat treatment in a selenium atmosphere process used to form the CIGS S6c. The thickness of the MoCu layer 24 may, according to example embodiments herein such as the FIG. 2 embodiment, preferably be, for example, in the range of from about 5-800 nm thick, more preferably from 100-600 nm thick, even more preferably from about 150-300 nm, with an example thickness being about 200 nm. In addition, in a preferred example embodiment of the MoCu based layer 24 in FIGS. 2-5, the layer 24 comprising or consisting essentially of MoCu may include, by weight, from about 10-90% Mo, more preferably from about 20-80% Mo, still more preferably from about 20-60% Mo, even more preferably from about 20-40% Mo, and from about 20-90% Cu, more preferably from about 30-90% Cu, still more preferably from about 40-80% Cu, even more preferably from about 60-80% Cu, with an example MoCu alloy including about 30% Mo and about 70% Cu. After the back contact structure 36 comprising a MoCu layer 24 is deposited on the back glass substrate 22, as discussed above, the active or absorbing region 28 of the device 20 is then deposited over the MoCu layer 24 of the back contact structure. As described above, according to certain embodiments, the active or absorbing layer 28 preferably comprises a semiconductor layer 28 comprising copper indium diselenide or p-type CIGS layer (approximately $CuIn_{X-1}Ga_XSe_2$). The CIGS layer 28 may be formed S6, for example, by depositing a "seed" layer comprising Cu by, for example, co-evaporation, sputtering, electroplating or any other suitable deposition technique S6a. Other components of the CIGS absorbing layer 28, e.g., indium and/or gallium, are deposited on the Cu layer S6b and react with the Cu at high temperature, such as, for example, about 550° C., in a selenium atmosphere S6c, thereby forming the CIGS semiconductor absorber 28 in step S6. As noted above, a result of the high-temperature selenization process S6c used to form the CIGS, a transition layer of MoCuSe 26 may be formed between the CIGS absorber 28 and the MoCu back contact 24. The steps described so far are directed to forming a coated article for use in a photovoltaic device (e.g. a solar cell). Further processing steps may be performed to complete a device 20. For example, deposition of the CIGS absorber 28 may be followed by wet-deposition of a cadmium sulfide (CdS) window layer. Additionally, a wide bandgap semiconductor material, such as, for example, a bi-layer of a ZnO and an n-type conductive Al-doped ZnO may be formed on the CdS window. The device 20 may then be completed by providing a series of front face contacts in the form of, for example, a metal grid (not shown), on top of the ZnO/ZnO:Al contact layer, and a front glass substrate comprising, for example, soda-lime silica based glass.

FIG. 5B is an illustration of additional steps that may be taken in making a coated article for use in a photovoltaic device according to certain further example embodiments disclosed herein, such as, for example, the example coated article illustrated in FIG. 3. In addition to the steps discussed above with respect to FIG. 5A, further steps may be taken to realize other example embodiments. For example, after providing the back glass substrate in S1, a multi-layer back contact arrangement including a layer comprising or consisting essentially of Mo 29 and a layer comprising or consisting essentially of MoCu 24 is then provided in steps S2 and S5, respectively. According to certain example embodiment, after the back substrate 22 is provided S1, a layer comprising or consisting of essentially Mo 29 is deposited over the back substrate 22 (S2). In a preferred example, the layer comprising or consisting essentially of Mo 29 is deposited using direct-current magnetron sputtering. After depositing the Mo layer 29, a layer comprising or consisting essentially of MoCu 24 is deposited S5 over the Mo layer 29. The thickness of the MoCu layer 24 may, according to the example embodiments illustrated in FIG. 3, preferably be, for example, in the range of about 1-300 nm, more preferably from about 5-200 nm, even more preferably from about 30-80 nm, with an example thickness being about 50 nm. In certain example embodiments, the Mo layer 29 is thicker than the MoCu layer 24 in the FIG. 3 embodiment. After the back contact structure comprising a Mo layer 29 and a MoCu layer 24 is deposited on the back glass substrate 22, as discussed above, the active or absorbing region 28 of the device 20 is then deposited over the MoCu layer 24 of the back contact structure. As described above, according to certain embodiments, the active or absorbing layer 28 preferably comprises a semiconductor layer 28 comprising copper indium diselenide or p-type CIGS layer (approximately $CuIn_{X-1}Ga_XSe_2$). The CIGS layer 28 may be formed S6, for example, by depositing a "seed" layer comprising Cu by, for example, co-evaporation, sputtering, electroplating or any other suitable deposition technique S6a. Other components of the CIGS absorbing layer 28, e.g., indium and/or gallium, are deposited on the Cu layer S6b and react with the Cu at high temperature, such as, for example, about 550° C., in a selenium atmosphere S6c, thereby forming the CIGS semiconductor absorber 28 in step S6. As noted above, a result of the high-temperature selenization process S6c used to form the CIGS, a transition layer of MoCuSe 26 may be formed between the CIGS absorber 28 and the MoCu back contact 24.

FIG. 5C is an illustration of additional steps that may be taken in making a coated article for use in a photovoltaic device according to certain further example embodiments disclosed herein, such as, for example, the example coated article illustrated in FIG. 4. For example, after providing the back glass substrate in S1, a multi-layer back contact arrangement including a layer comprising or consisting essentially of Cu 32 (e.g., substituting a Cu layer 32 as shown in FIG. 4 for the Mo layer 29 illustrated in FIGS. 3 and 5B) and a layer comprising or consisting essentially of MoCu 24 is then provided in steps S4 and S5, respectively. According to certain example embodiment, after the back substrate 22 is provided S1, a layer comprising or consisting of essentially Cu 32 is deposited over the back substrate 22 (S4). In a preferred example, the layer comprising or consisting essentially of Cu 32 is deposited using direct-current magnetron sputtering. The thickness of the Cu layer 32 may be within the same range discussed above for Mo layer 29. After depositing the Cu layer 32, a layer comprising or consisting essentially of MoCu 24 is deposited S5 over the Cu layer 32. The thickness of the MoCu layer 24 may, according to the example embodiments illustrated in FIG. 4, preferably be, for example, in the range of about 1-300 nm, more preferably from about 5-200 nm, even more preferably from about 30-80 nm, with an example thickness being about 50 nm. After the back contact structure comprising a Cu layer 32 and a MoCu layer 24 is deposited on the back glass substrate 22, as discussed above, the active or absorbing region 28 of the device 20 is then deposited over the MoCu layer 24 of the back contact structure. As described above, according to certain embodiments, the active or absorbing layer 28 preferably comprises a semiconductor layer 28 comprising copper indium diselenide or p-type CIGS layer (approximately $CuIn_{X-1}Ga_XSe_2$). The CIGS layer 28 may be formed S6, for example, by depositing a "seed" layer comprising Cu by, for example, co-evaporation, sputtering, electroplating or any other suitable deposition technique S6a. Other components of the CIGS absorbing layer 28, e.g., indium and/or gallium, are deposited on the Cu layer S6b and react with the Cu at high temperature, such as, for example, about 550° C., in a selenium atmosphere S6c, thereby forming the CIGS semiconductor absorber 28 in step S6. As noted above, a result of the high-temperature selenization process S6c used to form the CIGS, a transition layer of MoCuSe 26 may be formed between the CIGS absorber 28 and the MoCu back contact 24.

Additionally, in certain example embodiments, such as, for example, the embodiment illustrated in FIG. 4, a $CuO_X$ layer 30 may be optionally deposited S3 and is used to form a solid bond between the back glass substrate 22 and the Cu layer 32 of the multi-layer back contact configuration, as metal copper does not generally adhere well to glass. The stress matching or adhesion layer 30, according to certain example embodiments, may be deposited, for example, and without limitation, by reactive sputtering from a metal Cu target in an argon and oxygen $(Ar+O_2)$ atmosphere, wherein the partial pressures of oxygen may be, for example, and without limitation, around about 0.3 to 0.6 mTorr. The resulting thickness of the $CuO_X$ matching/adhesion layer 30 may be, for example, preferably in a range of ~1-60 nm, and more preferably in a range of about 3-50 nm. Other possible alternatives for matching/adhering Cu to the back glass substrate may include, for example, and without limitation, a thin (e.g., ~1-10 nm) titanium (Ti) or chromium (Cr) layer. After the matching/adhesion layer 30 is deposited on the back glass substrate 22, a portion of the multi layer back contact comprising a Cu layer 32 is deposited on matching/adhesion layer 30 in step S4, along the lines described above.

As noted above, in the example embodiments disclosed and discussed herein, for example, the thickness of the substantially MoCu containing portion of the reflective rear contact may, for example, preferably be in a range of about 5-800 nm. In certain other example embodiments, the thickness of the substantially MoCu containing portion of the reflective rear contact may, for example, preferably be in a range of about 100-600 nm, and may still further preferably, for example, be in a range of 5-200 nm, and may still further preferably be about 200 nm or 50 nm. Moreover, according to certain example embodiments disclosed and discussed herein, the substantially MoCu containing portion of the reflective rear contact may, for example, and without limitation, have preferred compositions in the range of from about 20 wt. % Mo/80 wt. % Cu to 80 wt. % Mo/20 wt. % Cu. In other words, the Mo content of the substantially MoCu containing portion of the reflective rear contact may be from about 20-80%, and the Cu content of the same portion may also be in a range from about 20-80%. In other example embodiments the preferred composition of the substantially MoCu containing portion of the reflective rear contact may be, for example, and without limitation, about 30 wt. % Mo/70 wt. % Cu. in which, for example, the thickness of the Mo layer may be, for example, preferably in the range of 5-300 nm and the thickness of the Cu layer may be, for example, preferably in the range of 20-200 nm thick. The MoCu layer 24 may or may not be oxidation graded in certain example embodiments (where the higher oxygen content portion is closer to substrate 22), and may optionally be doped with other material(s). In different embodiments regarding FIG. 2, the MoCu layer 24 may be (i) metallic, (ii) mostly metallic, (iii) oxidation graded, and/or (iv) made up of a metallic layer portion and an oxygen inclusive layer portion where the oxygen inclusive layer portion is closer to the substrate 22.

In certain embodiments of this invention, there is provided a photovoltaic device comprising: a front substrate; a semiconductor absorber film; a back contact comprising a conductive layer comprising molybdenum and copper; and a rear substrate; wherein the conductive layer comprising molybdenum and copper is located between at least the rear substrate and the semiconductor absorber film, and wherein the semiconductor absorber film is located between at least the back contact and the front substrate.

In the photovoltaic device of the immediately preceding paragraph, the conductive layer comprising molybdenum and copper may be disposed adjacent to and contacting said semiconductor absorber film.

In the photovoltaic device of any of the preceding two paragraphs, the semiconductor absorber film may comprise CIGS.

In the photovoltaic device of any of the preceding three paragraphs, a transitional portion or layer comprising MoCuSe may be between the conductive layer and the semiconductor absorber film.

In the photovoltaic device of any of the preceding four paragraphs, a substantially transparent conductive front electrode comprising a substantially transparent metal oxide may be provided.

In the photovoltaic device of the immediately preceding paragraph, the substantially transparent front electrode may be doped with an n-type conductive metal, and/or the substantially transparent front electrode may comprise a bi-layer comprising ZnO and ZnO doped with n-type conductive Al.

In the photovoltaic device of any of the preceding six paragraphs, said back contact may further comprise a second conductive layer disposed between the rear substrate and the conductive layer comprising molybdenum and copper.

In the photovoltaic device of the immediately preceding paragraph, the second conductive layer may comprise or consist essentially of molybdenum or copper.

In the photovoltaic device of any of the preceding eight paragraphs, the conductive layer comprising molybdenum and copper may have a thickness of from about 100-600 nm.

In the photovoltaic device of any of the preceding nine paragraphs, the conductive layer may consist essentially of molybdenum and copper.

The photovoltaic device of any of the preceding ten paragraphs may further comprise a stress matching layer comprising $CuO_X$ disposed adjacent the rear substrate and between the rear substrate and a second conductive layer comprising or consisting essentially of copper.

In the photovoltaic device of any of the preceding eleven paragraphs, the conductive layer may include from about 10-90% Mo, more preferably from about 20-80% Mo, still more preferably from about 20-60% Mo, even more preferably from about 20-40% Mo, and from about 20-90% Cu, more preferably from about 30-90% Cu, still more preferably from about 40-80% Cu, even more preferably from about 60-80% Cu, with an example MoCu alloy including about 30% Mo and about 70% Cu. In certain example embodiments, the conductive layer includes more Cu than Mo by weight.

In the photovoltaic device of any of the preceding twelve paragraphs, the conductive layer with molybdenum and copper may have a thickness of from about 5-200 nm, more preferably from about 30-80 nm.

In the photovoltaic device of any of the preceding thirteen paragraphs, a dielectric layer (e.g., of or including silicon nitride and/or silicon oxynitride) may be located between at least the rear substrate and the conductive layer comprising molybdenum and copper.

While certain example aspects of a coated article for use in photovoltaic devices and methods for making the same are described and discussed with respect to various example embodiments herein, it is to be understood that these example embodiments are meant to illustrative, not limiting. One skilled in the art would understand that various modifications may be made without departing from the true spirit and full scope of the following claims.

What is claimed is:

1. A photovoltaic device, comprising:
a front substrate;
a semiconductor absorber film;
a back contact comprising a conductive layer comprising molybdenum and copper; and
a rear glass substrate;
wherein the conductive layer comprising molybdenum and copper is located between at least the rear glass substrate and the semiconductor absorber film, wherein the conductive layer includes, by weight, from about 20-40% Mo and from about 60-80% Cu,
wherein the semiconductor absorber film is located between at least the back contact and the front substrate; and
wherein the conductive layer comprising molybdenum and copper is located adjacent to and directly contacting the rear glass substrate.

2. The photovoltaic device of claim 1, wherein the conductive layer comprising molybdenum and copper is disposed adjacent to and contacting said semiconductor absorber film.

3. The photovoltaic device of claim 1, wherein the semiconductor absorber film comprises CIGS.

4. The photovoltaic device of claim 1, further comprising a transitional portion or layer comprising MoCuSe between the conductive layer and the semiconductor absorber film.

5. The photovoltaic device of claim 1, further comprising a substantially transparent conductive front electrode comprising a substantially transparent metal oxide.

6. The photovoltaic device of claim 1, wherein the conductive layer comprising molybdenum and copper has a thickness of from about 100-600 nm.

7. The photovoltaic device of claim 1, wherein the conductive layer consists essentially of molybdenum and copper.

8. The photovoltaic device of claim 1, wherein the conductive layer comprising molybdenum and copper has a thickness of from about 5-200 nm.

9. The photovoltaic device of claim 1, wherein the conductive layer comprising molybdenum and copper has a thickness of from about 30-80 nm.

10. The photovoltaic device of claim 1, wherein the conductive layer comprising molybdenum and copper includes, by weight, about 30% Mo and about 70% Cu.

11. A photovoltaic device, comprising:
a front substrate;
a semiconductor absorber film;
a back contact comprising a conductive layer comprising molybdenum and tantalum; and
a rear glass substrate;
wherein the conductive layer comprising molybdenum and tantalum is located between at least the rear glass substrate and the semiconductor absorber film, wherein the conductive layer comprises by weight from about 20-40% Mo and from about 60-80% Ta;
wherein the semiconductor absorber film is located between at least the back contact and the front substrate.

* * * * *